United States Patent
Sato et al.

(10) Patent No.: US 7,460,100 B2
(45) Date of Patent: *Dec. 2, 2008

(54) LIQUID CRYSTAL DISPLAY APPARATUS HAVING LEVEL CONVERSION CIRCUIT

(75) Inventors: Hideo Sato, Hitachi (JP); Yoshiro Mikami, Hitachi (JP); Hiroshi Kageyama, Hitachi (JP); Tatsuya Ohkubo, Chigasaki (JP)

(73) Assignee: Hitachi, Ltd., Tokyo (JP)

( * ) Notice: Subject to any disclaimer, the term of this patent is extended or adjusted under 35 U.S.C. 154(b) by 541 days.

This patent is subject to a terminal disclaimer.

(21) Appl. No.: 11/148,260

(22) Filed: Jun. 9, 2005

(65) Prior Publication Data

US 2006/0007216 A1 Jan. 12, 2006

Related U.S. Application Data

(63) Continuation of application No. 10/797,013, filed on Mar. 11, 2004, now Pat. No. 6,919,873, which is a continuation of application No. 10/150,952, filed on May 21, 2002, now Pat. No. 6,714,184, which is a continuation of application No. 09/337,260, filed on Jun. 22, 1999, now Pat. No. 6,392,625.

(30) Foreign Application Priority Data

Jun. 23, 1998 (JP) ................................. 10-192389

(51) Int. Cl.
*G09G 3/36* (2006.01)
(52) U.S. Cl. ............................. 345/98; 345/94; 345/95; 345/100; 345/211

(58) Field of Classification Search ........... 345/87–100, 345/204–215
See application file for complete search history.

(56) References Cited

U.S. PATENT DOCUMENTS

| 5,323,171 | A | 6/1994 | Yokouchi et al. |
| 5,457,420 | A | 10/1995 | Asada et al. |
| 5,467,043 | A | 11/1995 | Ohi |
| 5,576,729 | A | 11/1996 | Yamazaki |
| 5,646,642 | A | 7/1997 | Maekawa et al. |
| 5,995,073 | A | 11/1999 | Isami et al. |
| 6,081,131 | A | 6/2000 | Ishii |

(Continued)

FOREIGN PATENT DOCUMENTS

| JP | 6-216753 | 8/1994 |
| JP | 6-283979 | 10/1994 |

*Primary Examiner*—Vijay Shankar
(74) *Attorney, Agent, or Firm*—Antonelli, Terry, Stout & Kraus, LLP.

(57) ABSTRACT

A liquid crystal display apparatus having a level conversion circuit in which a high speed operation can be attained and also a small transistor capacity can be obtained is provided. In the liquid crystal display apparatus, a signal circuit for driving pixel elements of a display unit and a scanning circuit are provided. The level conversion circuit is constituted of a first and a second transistors 111 and 112 in which a respective gate electrodes is connected to a first bias voltage power supply, and a third and a fourth transistors 121 and 122 in which a respective gate electrodes is connected to a second bias voltage power supply and a respective source electrodes is connected to a power supply.

18 Claims, 5 Drawing Sheets

U.S. PATENT DOCUMENTS

| | | |
|---|---|---|
| 6,191,779 B1 | 2/2001 | Taguchi et al. |
| 6,229,513 B1 | 5/2001 | Nakano et al. |
| 6,392,625 B1 | 5/2002 | Sato et al. |
| 6,714,184 B2 | 3/2004 | Sato et al. |
| 6,919,873 B2 * | 7/2005 | Sato et al. ............ 345/98 |

* cited by examiner

LIQUID CRYSTAL DISPLAY APPARATUS HAVING LEVEL CONVERSION CIRCUIT

CROSS-REFERENCE TO RELATED APPLICATIONS

This is a continuation of application Ser. No. 10/797,013 filed 11 Mar. 2004, now U.S. Pat. No. 6,919,873, which is a continuation of application Ser. No. 10/150,952 filed 21 May 2002 and issued as U.S. Pat. No. 6,714,184 B2, which is a continuation of application Ser. No. 09/337,260 filed 22 Jun. 1999 and issued as U.S. Pat. No. 6,392,625 B1, the contents of all of which are incorporated herein by reference in their entirety.

BACKGROUND OF THE INVENTION

The present invention relates to a liquid crystal display apparatus having a level conversion circuit in which a signal having a low voltage amplitude is converted to a signal having a high voltage amplitude; and, in particular, the invention relates to a level conversion circuit for use in a clock interface and a data interface of a liquid crystal display apparatus using thin-film transistors (TFT: Thin-Film Transistor).

A level conversion circuit of the type used in a clock interface and a data interface of a liquid crystal display apparatus is described in, for example JP-A 6-216753 and JP-A 6-283979. In the level conversion circuit shown in these publications, a thin-film transistor, such as a multi-crystallization silicon and a metal-oxide semiconductor (MOS: Metal-Oxide Semiconductor) having a mono-crystallization silicon, are employed. In such a level conversion circuit, an input signal having a low voltage amplitude is converted to an output signal having a high voltage amplitude for use in a drive circuit for the liquid crystal display apparatus.

The above-stated input signal has, for example, a voltage amplitude of 5 V or 3.3 V, such as used in a common LSI. Further, the above-stated output signal has, for example, a voltage amplitude of 12 V or 15 V, which corresponds to a power supply voltage of an interior circuit of the level conversion circuit.

As examples of this level conversion circuit, there are a differential input type level conversion circuit, which inputs a mutually reverse phase signal, and a single phase input type level conversion circuit, which inputs an independent signal. The differential input type level conversion circuit is used in a comparatively high speed clock interface, and the single phase input type level conversion circuit is used in a data interface.

FIG. 9 shows an example of the differential input type level conversion circuit described in JP-A 6-216753. This level conversion circuit 800 is constituted by a pair of input transistors 811 and 812, a pair of load transistors 813 and 814, a pair of constant current power supplies 815 and 816, and a pair of level shift transistors 817 and 818.

The respective input transistors 811 and 812 and the respective level shift transistors 817 and 818 are each provided as an N type TFT. The respective load transistors 813 and 814 are each provided as a P type TFT. In the level shift transistors 817 and 818, a drain electrode and a gate electrode are connected to each other and respective source electrodes are connected to input terminals VIN1 and VIN2. Further, to a connection point of the drain electrode and the gate electrode, the constant current power supplies 815 and 816 and the gate electrodes of the input transistors 811 and 812 are connected.

The respective source electrodes of the input transistors 811 and 812 are connected to ground and the respective drain electrodes of the input transistors 811 and 812 are connected to the respective output terminals VOUT1 and VOUT2. The respective drain electrodes of the load transistors 813 and 814 are connected respectively to output terminals VOUT1 and VOUT2. The respective gate electrodes of the load transistors 813 and 814 are connected respectively to the output terminals VOUT2 and VOUT1. The respective source electrodes of the load transistors 813 and 814 are connected to a power supply VDD.

In the level conversion circuit 800 connected in the above-described manner, the signals which are supplied at the input terminals VIN1 and VIN2 have a mutually reverse phase. Herein, the operation state of the level conversion circuit 800 will be explained on the assumption that the voltages which are inputted to the input terminals VIN1 and VIN2 are 3.3 V and 0 V, respectively, the voltage of the power supply VDD is 15 V, and a threshold voltage of the respective N type transistors is 2 V.

Since each of the level shift transistors 817 and 818 operates to increase the voltage level at the input terminals VIN1 and VIN2 with a threshold voltage, the voltages of 5.3 V and 2 V are applied respectively to the gate electrodes of the input transistors 811 and 812. As a result, the input transistor 811 presents a conductive state and the input transistor 812 presents a non-conductive state, respectively, and then the voltage of the output terminal VOUT1 becomes 0 V.

Since this output terminal VOUT1 is connected to the gate electrode of the load transistor 814, the load transistor 814 presents a conductive state and then the voltage of the output terminal VOUT2 becomes 15 V. Further, since the load transistor 814 whose gate electrode is connected to the output terminal VOUT2 becomes a non-conductive state, then the output terminal VOUT1 maintains the voltage of 0 V.

Next, from the above-described state, the operation wherein the voltages of the input terminals VIN1 and VIN2 change respectively to 0 V and 3.3 V will be explained. When the voltages of the input terminals VIN1 and VIN2 change respectively to 0 V and 3.3 V, the input transistor 811 presents the conductive state, but the input transistor 812 presents a non-conductive state, respectively.

At this time, since the load transistor 814, which is connected to the drain electrode of the input transistor 812 becoming the conductive state, presents the conductive state, when the resistances at the conductive states of the input transistor 812 and the load transistor 814 are expressed by RON2 and RON4, the voltage VOUT2 of the output terminal VOUT2 at the time at which the voltage of the input terminal changes is expressed by the following formula 1.

$$VOUT2 = RON2/(RON2+RON4) \times VDD \qquad (1)$$

As understood from the above-stated formula 1, the voltage of the output terminal VOUT2 at the time at which the voltage of the input terminal changes is determined by a divided voltage ratio between the resistances RON2 and RON4. With the above stated voltage, the load transistor 813 presents the conductive state and the voltage of the output terminal VOUT1 changes to 15 V. Since the voltage of the output terminal VOUT1 changes to 15 V, the resistance of the load transistor 814 increases, and finally the load transistor 814 presents a non-conductive state. As a result, the voltage of the output terminal VOUT2 becomes 0 V.

Herein, to shorten the time from when the conductive state of the input transistor 812 occurs to the time when the voltage of the output terminal VOUT2 becomes 0 V, it is necessary to make the voltage of the output terminal VOUT2 approach 0 V as soon as possible by making the resistance value of the resistor RON2 small in the formula 1.

On the other hand, in the single phase input type level conversion circuit, one approach is employed using the differential input type level conversion circuit explained above, in which a single signal is inputted to one input terminal and a voltage having ½ of the single phase input amplitude is supplied to the other input terminal; or another approach is employed using the differential input type level conversion circuit explained above, in which a single signal is inputted to one input terminal and the single phase input amplitude is supplied to the other input terminal by reversing the single phase signal.

SUMMARY OF THE INVENTION

When the voltage between the drain electrode and the source electrode is constant, the drain current of a TFT or MOS transistor changes in proportion to a square of the effective gate voltage VE, which is a difference between the gate voltage and the threshold voltage Vth. Since the resistance RON, such as RON2 and RON4, under the above-stated conductive state is in inverse proportion to this drain current, the gate voltage increases abruptly in the vicinity of the threshold voltage Vth.

In the case of the above-described level conversion circuit 800, the drive condition of the gate voltages of the input transistors 811 and 812 corresponds to a voltage Vg1 between the gate electrode and the drain electrode of 2 V and a voltage Vg2 between the gate electrode and the drain electrode of 5.3 V.

To obtain the resistance under the conductive state necessary for a voltage Vg2 of 5.3 V, it is necessary to make the size of the input transistor large. When the size of the input transistor is made large, the capacity of the input terminal increases and also the capacity between the gate electrode and the drain electrode increases.

Further, since the input transistors 811 and 812 of the level conversion circuit 800 shown in FIG. 9 constitute a source ground type amplification circuit, the capacity between the gate electrode and the drain electrode is made large equivalently with a magnification of an amplification by the Miller effect. The increase in the equivalent load capacity becomes an obstacle to achieve high speed operation.

Further, the conventional single phase input type level conversion circuit is more complicated in comparison with the differential input type level conversion circuit. This means, for example, that, when an attempt is made to apply the single phase input type level conversion circuit to a digital type liquid crystal display apparatus, which is operated by an image signal in the form of a digital signal, the complexity becomes a large obstacle.

When an image is sent in the form of a digital signal, the data size thereof depends on the number of colors (a number of gray level) in the image signal, the pixel element number of the liquid crystal display apparatus, the frame frequency, and the operation frequency of the level conversion circuit. For example, in a case where the number of colors (number of gray level) requires 8 bits, the pixel element number is 1280× 1024, the frame frequency is 60 Hz, and the operation frequency is 20 MHz, the input data size is about 32 bits.

An object of the present invention is to provide a liquid crystal display apparatus having a level conversion circuit which is able to carry out a high speed operation in the liquid crystal display apparatus.

Another object of the present invention is to provide a liquid crystal display apparatus having a level conversion circuit which can be constituted by a small transistor capacity in the liquid crystal display apparatus.

According to the present invention, the above-stated objects can be attained in a liquid crystal display apparatus, wherein a level conversion circuit is provided for a signal circuit for driving the pixel elements of a display unit and a scanning circuit, the level conversion circuit is constituted of a first transistor and a second transistor in which the respective gate electrodes of the first transistor and the second transistor are connected to a first bias voltage power supply, and a third transistor and a fourth transistor in which respective gate electrodes of the third transistor and the fourth transistor are connected to a second bias voltage power supply and respective drain electrodes of the third transistor and the fourth transistor are connected to a power supply.

The respective drain electrodes of the first transistor and the second transistor are connected to respective drain electrodes of the third transistor and the fourth transistor, a signal having a mutually different polarity and having a low amplitude is inputted to the respective source electrodes of the first transistor and the second transistor, and from the drain electrode of the first transistor and the respective drain electrode of the first transistor and the second transistor, a signal having a mutually different polarity and having a high amplitude is taken out.

In accordance with the present invention, an output voltage is determined in accordance with a resistance ratio between the drain electrode and the source electrode of the first transistor and the second transistor in which respective gate electrodes are biased by the first bias voltage power supply and the third transistor and the fourth transistor in which respective gate electrodes are biased by the second bias voltage power supply.

Herein, a third resistor and a fourth resistor can be made large within an allowable range of operation speed. Further, since the respective gate electrodes of the first transistor and the second transistor are biased to a fixed voltage, the capacity between the drain electrode and the source electrode is not dependent on the amplification rate of the first transistor and the second transistor. As a result, the level conversion circuit according to the present invention can be operated at a high speed and the size of the transistor can be reduced.

DESCRIPTION OF EXAMPLE EMBODIMENTS OF THE PRESENT INVENTION

Hereinafter, a liquid crystal display apparatus having a level conversion circuit representing one embodiment according to the present invention will be explained with reference to the drawings.

Figure 1:
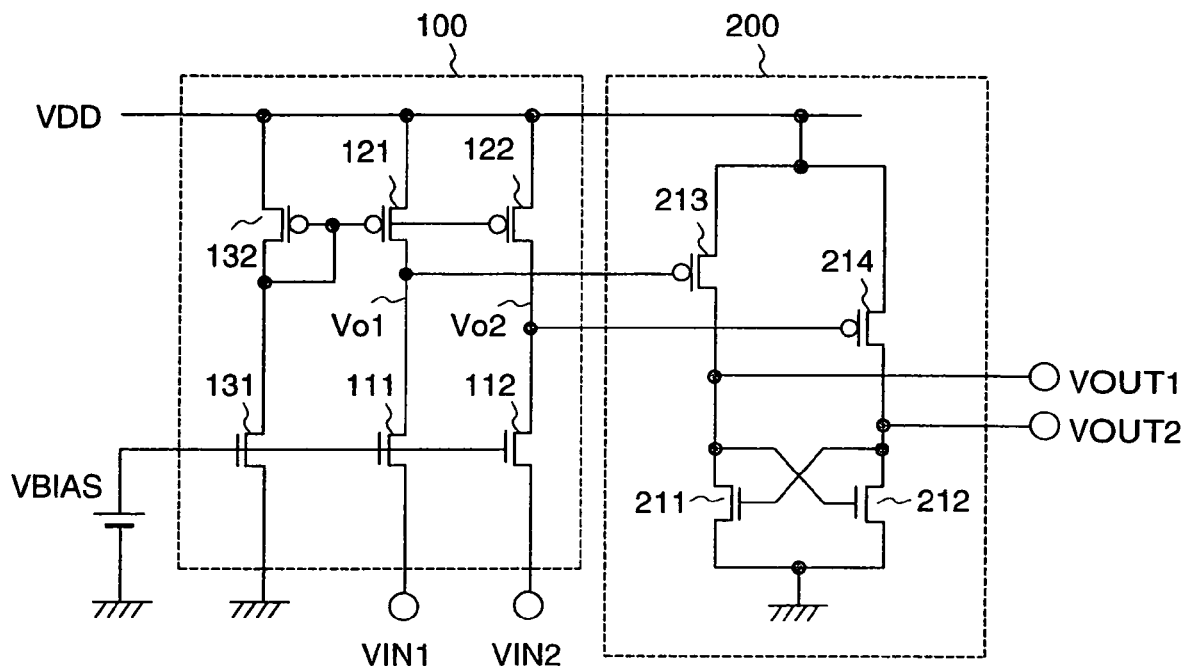
FIG. 1 is a schematic diagram showing a level conversion circuit in a liquid crystal display apparatus representing a first embodiment according to the present invention.

FIG. 1 shows a level conversion circuit in a liquid crystal display apparatus forming a first embodiment according to the present invention. The level conversion circuit is constituted by a level conversion unit 100 and a wave-form shaping unit 200.

The level conversion unit 100 is constituted by input transistors 111 and 112, load transistors 121 and 122, and bias transistors 131 and 132. In the level conversion unit 100, a respective gate electrode of the respective input transistors 111 and 112 is connected to a bias power supply VBIAS, a respective source electrode of the respective input transistors 111 and 112 is connected to input terminals VIN1 and VIN2, and a respective drain electrode of the respective input transistors 111 and 112 is connected to outputs Vo1 and Vo2, respectively.

In the level conversion unit 100, the gate electrodes of the respective load transistors 121 and 122 are connected in common to the bias use transistor 132, the source electrodes of the load transistors 121 and 122 are connected to a power supply VDD, and the drain electrodes of the respective load transistors 121 and 122 are connected to the outputs Vo1 and Vo2, respectively.

The gate electrode of the bias transistor 131 is connected to the bias power supply VBIAS, the source electrode of the bias transistor 131 is connected to a ground point, and the drain electrode of the bias transistor 131 is connected to the gate electrode and the drain electrode of the bias transistor 132. Herein, the bias transistor 132 and the load transistors 121 and 122 constitute a so-called current-miller circuit.

On the other hand, the wave-form shaping unit 200 is constituted by input transistors 213 and 214 and load transistors 211 and 212. Each of the input transistors 213 and 214 is provided in the form of a P-type transistor, and each of the load transistors 211 and 212 is provided in the form of a N-type transistor. In comparison with the circuit construction of the above-stated level conversion circuit 800 shown in FIG. 9, the circuit construction of the first embodiment according to the present invention is different in that the conductivity type of the transistor is reversed and the input voltage has a high amplitude. However, the circuit configuration of the first embodiment according to the present invention is otherwise similar to the level conversion circuit 800 of FIG. 9.

To the respective gate electrodes of a pair of the input transistors 111 and 112 of the level conversion unit 100, the signals VIN1 and VIN2 are supplied, and these signals VIN1 and VIN2 have a mutually opposite phase. The signal levels of these signals VIN1 and VIN2 have voltages with a low amplitude of, for example, 0 V and 3.3 V, the voltage of the power supply VDD is 15 V, and the voltage of the bias power supply VBIAS exceeds the maximum voltage of the input signals VIN1 and VIN2 and is 5.3 V, for example.

Figure 2:
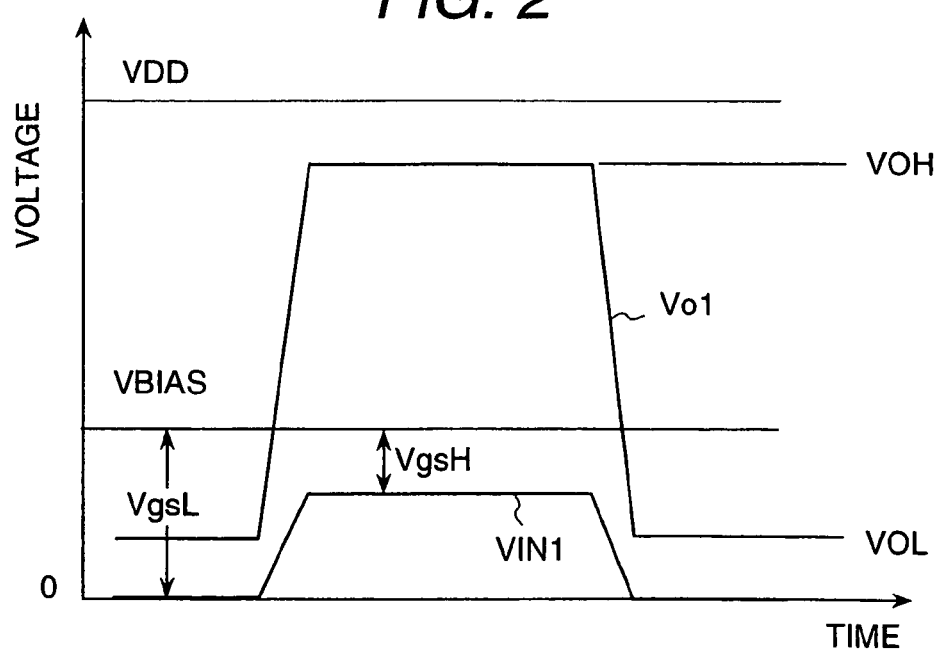
FIG. 2 is a signal diagram showing an operation of the level conversion circuit in the liquid crystal display apparatus according to the present invention.

The operation of the level conversion circuit under the above-stated conditions in the liquid crystal display apparatus of the first embodiment according to the present invention will be explained with reference to FIG. 2. Herein, the response of the output voltage Vo1 against the input signal VIN1 is shown. When the input signals VIN1 and VIN2 are 0 V and 3.3 V, respectively, the voltages VgsL and VgsH between the gate electrode and the source electrode of the input transistor 111 are 5.3 V and 2 V, respectively.

Since the resistance values RdsL and RdsH between the gate electrode and the source electrode of the input transistor 111, which corresponds to the above-stated voltages, have the relationship RdsL<RdsH, the output voltage Vo1 has a relationship of the same phase to the input signal VIN1. A high level output voltage VOH (when the input transistor 111 is in the non-conductive state) and a low level output VOL (when the input transistor 111 is in the conductive state) of the output voltage Vo1 at this time becomes a divided voltage between a resistance value RL1 between the drain electrode and the source electrode of the load transistor 121 and the resistance value RdsL or RdsH between the drain electrode and the source electrode of the input transistor 111. As a result, as shown in FIG. 2, the high level output voltage VOH is displaced a little from the power supply voltage VDD or the low level output VOL is displaced a little from the voltage of 0 V.

The response of the output voltage Vo2 relative to the input signal VIN2 is not shown in the figure, but the response of the output voltage Vo2 has a relationship of the reverse phase of the response of the input signal VIN1. Namely, the relationship between the input signals VIN1 and VIN2 of the level conversion unit 100 and the output voltages Vo1 and Vo2 of the level conversion unit 100 has the same phase. As a result, the output voltage Vo1 is displaced a little from the power supply voltage VDD and the output voltage Vo2 is displaced a little from 0 V.

Next, as stated above, the wave-form shaping unit 200 is constituted by the input transistors 213 and 214 and the load transistors 211 and 212. The respective input transistors 213 and 214 are provided in the form of a P-type TFT, and the respective load transistors 211 and 212 are provided in the form of a N-type TFT. The respective gate electrodes of the input transistors 213 and 214 are connected to the respective output terminals Vo1 and Vo2 of the level conversion circuit 100, respectively; the respective drain electrodes of the input transistors 213 and 214 are connected to the output terminals VOUT1 and VOUT2, respectively; and the respective source electrodes of the input transistors 213 and 214 are connected to the power supply voltage VDD, respectively.

Further, the respective drain electrodes of the load transistors 211 and 212 are connected to respective output terminals VOUT1 and VOUT2, respectively; the respective gate electrodes of the load transistors 211 and 212 are connected to the output terminals VOUT1 and VOUT2, respectively; and the respective source electrodes of the load transistors 211 and 212 are connected to the ground point, respectively.

Figure 9:
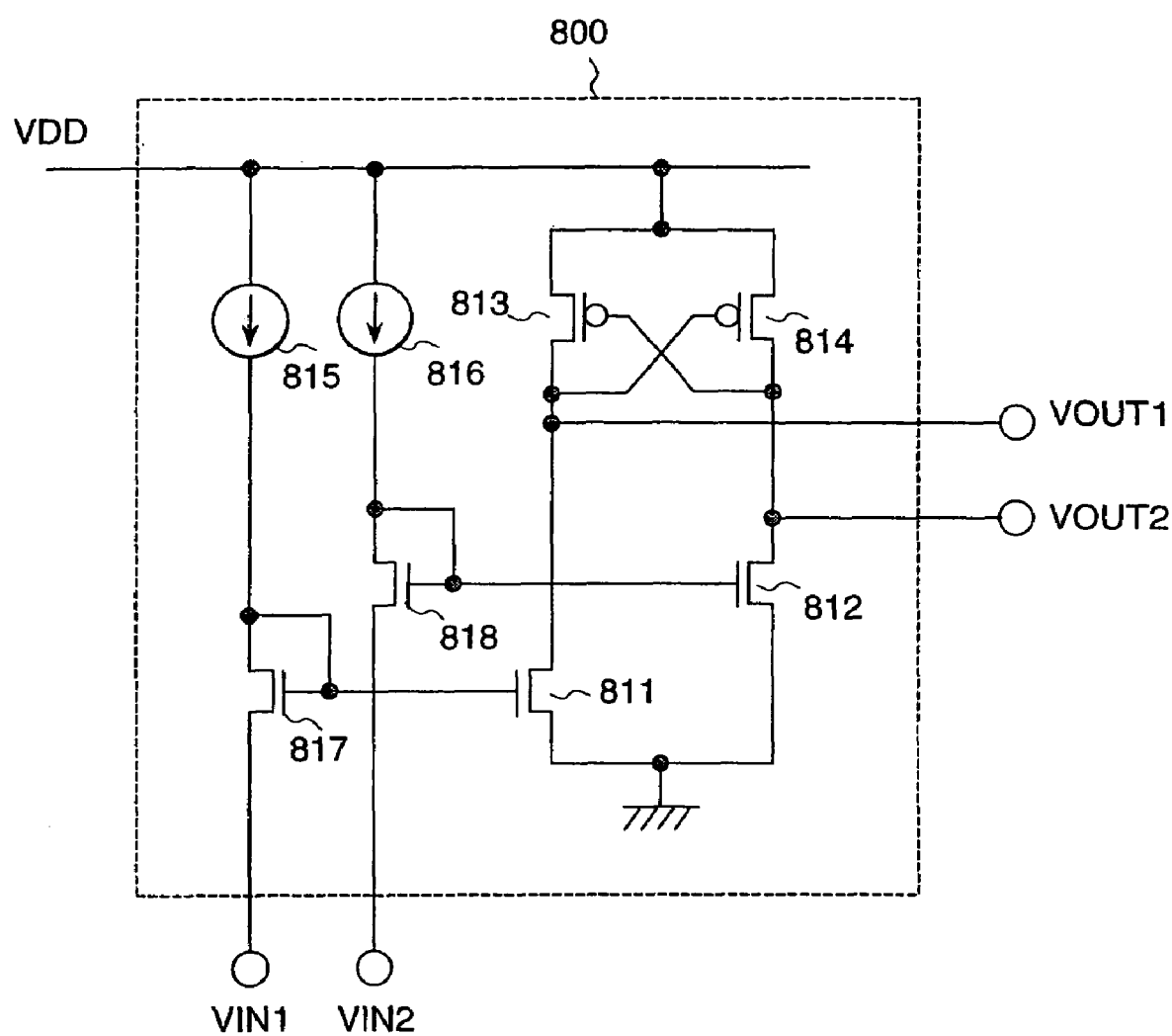
FIG. 9 is a schematic diagram showing a differential input type level conversion circuit according to the prior art.

The wave-form shaping unit 200 uses a different conductive type of transistor than that constituted by the input transistors 811 and 812 and the load transistors 813 and 814 in the circuit of FIG. 9, but is otherwise similar in configuration thereto.

The difference in construction of this first embodiment according to the present invention in comparison with the circuitry shown in FIG. 9 is as follows. Namely, the input signal is amplified in the level conversion unit 100 and has an amplitude which is substantially equal to the amplitude of the power supply voltage. As a result, it is unnecessary to make the size of the transistor large, which is a problem in the prior art, and thus it is possible to carry out a high speed operation.

More specifically, in the level conversion circuit for use in a liquid crystal display apparatus according to the present invention, by using the bias power supply VBIAS, the gate voltage for the input transistors 111 and 112 is controlled in accordance with the voltage of the bias power supply VBIAS. For the above-stated reasons, it is possible to make the current level of the drain current operation points of the input transistors 111 and 112 and the drain current operation points of the load transistors 121 and 122 high, and so it is possible to carry out a high speed operation.

Further, since the relationship between the input and the output involves the same phase, an increase in the capacity can be prevented according to the miller effect and with this point, it is possible to carry out a high speed operation.

In the level conversion circuit for use in the liquid crystal display apparatus of this first embodiment according to the present invention, since the level conversion circuit is constituted of only transistors, it has the advantage that the level conversion circuit can be manufactured easily.

Further, in the level conversion circuit for use in the liquid crystal display apparatus of this first embodiment according to the present invention, the bias transistor 131 and the input transistors 111 and 112 are constituted mutually of N-type transistors and the currents of the load transistors 121 and 122 are controlled in accordance with the bias transistor 132 and the output voltage is generated through this current and the resistances of the input transistors 111 and 112.

As a result, the fluctuation of the output voltage relative to the fluctuation of the characteristic of the transistor can be restrained, resulting in the advantage that the yield in the manufacturing can be heightened.

Figure 3:
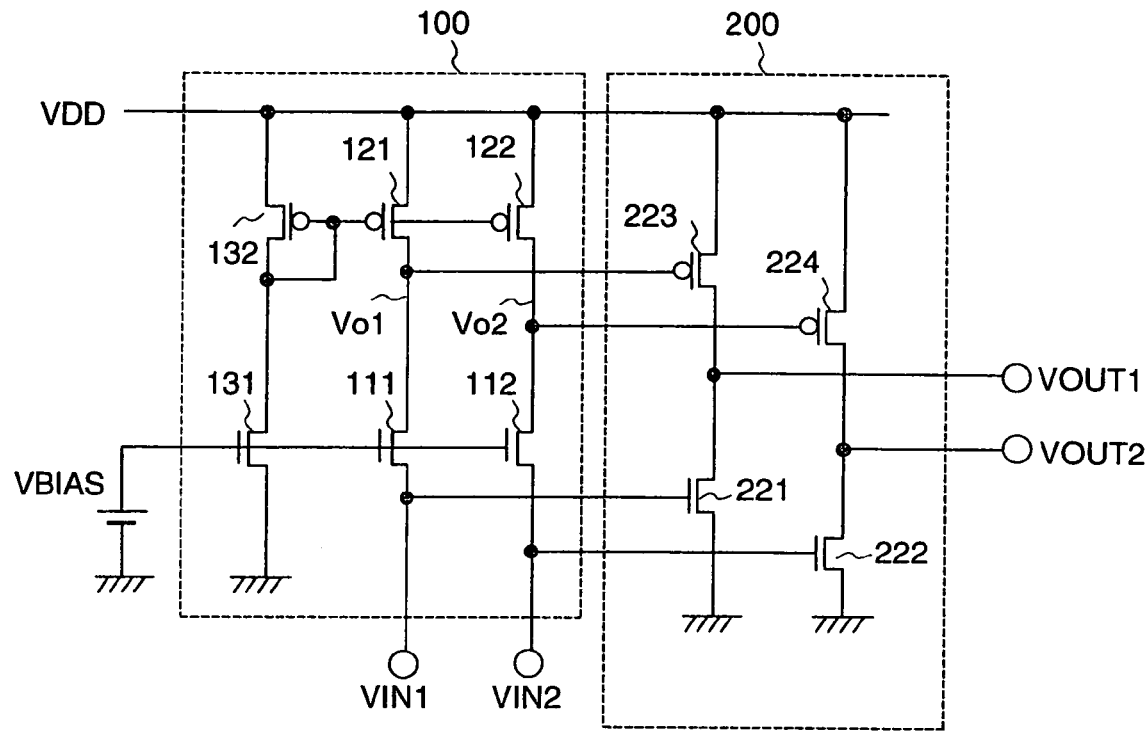
FIG. 3 is a schematic diagram showing a level conversion circuit in a liquid crystal display apparatus representing a second embodiment according to the present invention.

FIG. 3 shows a level conversion circuit in a liquid crystal display apparatus representing a second embodiment according to the present invention. This second embodiment according to the present invention differs from the first embodiment shown in FIG. 1, and the difference is in the wave-form shaping unit 200 shown in FIG. 3.

The wave-form shaping unit 200 of this second embodiment according to the present invention is constituted of N-type load transistors 221 and 222 and P-type input transistors 223 and 224. The respective source electrodes of the N-type load transistors 221 and 222 are grounded, the respective gate electrodes of the load transistors 221 and 222 are connected to the input terminals VIN1 and VIN2, and the respective drain electrodes of the load transistors 221 and 222 are connected to the respective drain electrodes of the P-type input transistors 223 and 224, respectively.

The respective source electrodes of the P-type input transistors 223 and 224 are connected to the power supply VDD and the respective gate electrodes of the input transistors 223 and 224 are connected to the outputs Vo1 and Vo2 of the level conversion unit 100, respectively.

The operation of the wave-form shaping unit 200 constituted as described above will be explained. As one example of the conditions of operation, when the voltages of the input terminals VIN1 and VIN2 are respectively 3.3 V and 0 V, the voltage of the power supply VDD is 15 V, and the voltage of the bias power supply is 5.3 V. In this case, the gate electrodes of the N-type load transistors 221 and 222 receive voltages of 3.3 V and 0 V, respectively, and the load transistor 221 is in the conductive state and the load transistor 222 is in the non-conductive state.

On the other hand, the gate electrodes of the P-type input transistors 223 and 224, to which the output of the level conversion unit 100 is inputted, receive the voltages of substantially 15 V and substantially 0 V, so that the load transistor 221 is in the conductive state and the load transistor 222 is in the non-conductive state.

As a result, the output terminals VOUT1 and VOUT2 become respectively 0 V and 15 V, and the low amplitude voltage signals of 3.3 V and 0 V are converted to high amplitude voltage signals of 0 V and 15 V.

According to the level conversion circuit in the liquid crystal display apparatus of the second embodiment according to the present invention, since each of the gate electrodes of the N-type load transistors and the gate electrodes of the P-type input transistors constituting the wave-form shaping unit 200 are controlled independently at 0.5 V and 15 V as a standard, there is the advantage that the level conversion circuit can be operated suitably relative to the fluctuation of the power supply voltage VDD.

Figure 4:
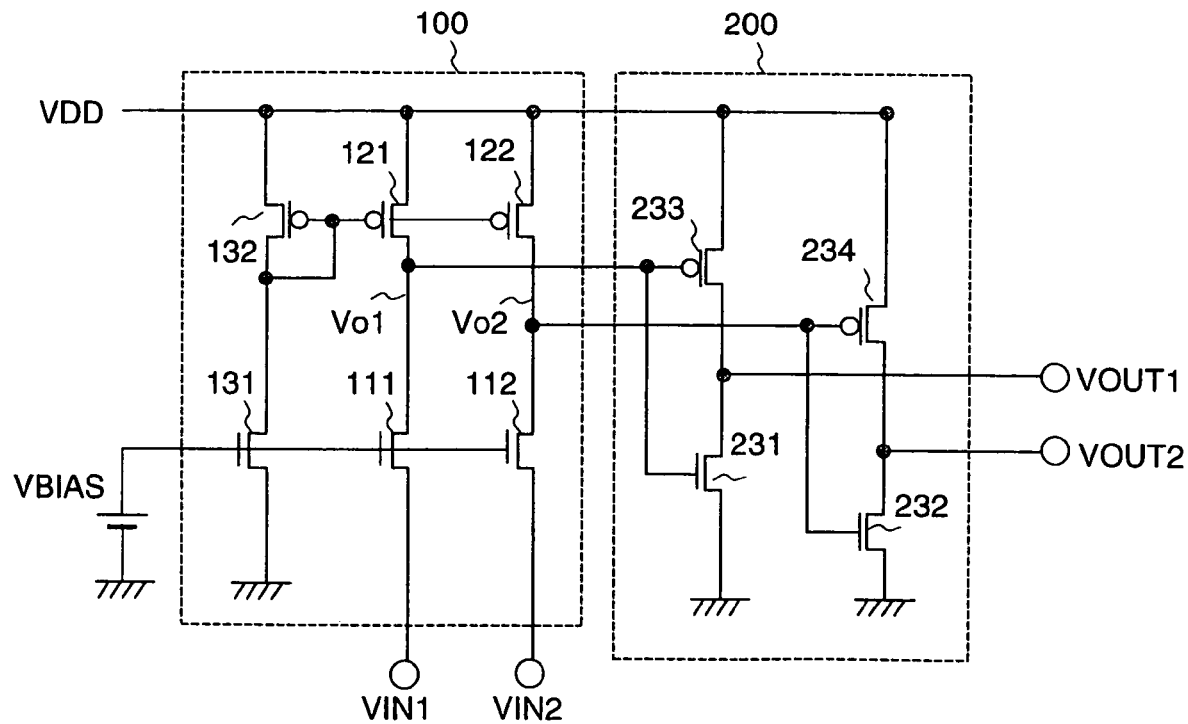
FIG. 4 is a schematic diagram showing a level conversion circuit in a liquid crystal display apparatus representing a third embodiment according to the present invention.

FIG. 4 shows a level conversion circuit in a liquid crystal display apparatus representing a third embodiment according to the present invention. This third embodiment differs from the first embodiment shown in FIG. 1, and the difference is in the wave-form shaping unit 200.

The wave-form shaping unit 200 of this third embodiment according to the present invention is constituted of N-type load transistors 231 and 232 and P-type input transistors 233 and 234. Each of the N-type load transistor 231 and the P-type input transistor 233 and each of the N-type load transistor 232 and the P-type input transistor 234 constitutes, respectively, an inverter circuit.

The operation of the wave-form shaping unit 200 constituted as described above will be explained. As one example of the conditions of operation, the voltages of the input terminals VIN1 and VIN2 are respectively 3.3 V and 0 V, the voltage of the power supply VDD is 15 V and the voltage of the bias power supply is 5.3 V in this case, the respective input transistors 111 and 112 are respectively in the conductive state and the non-conductive state, and the output voltages Vo1 and Vo2 of the level conversion circuit 100 are substantially 15 V and substantially 0 V. Since these output voltages are subjected to wave-form shaping and are amplified in the inverter circuit, the voltages of the output terminals VOUT1 and VOUT2 become respectively 0 V and 15 V.

According to the level conversion circuit 100 in the liquid crystal display apparatus of this third embodiment according to the present invention, the low amplitude voltage signals of 3.3 V and 0 V, which are supplied to the input terminals, can be converted to high amplitude voltage signals of 0 V and 15 V.

Figure 5:
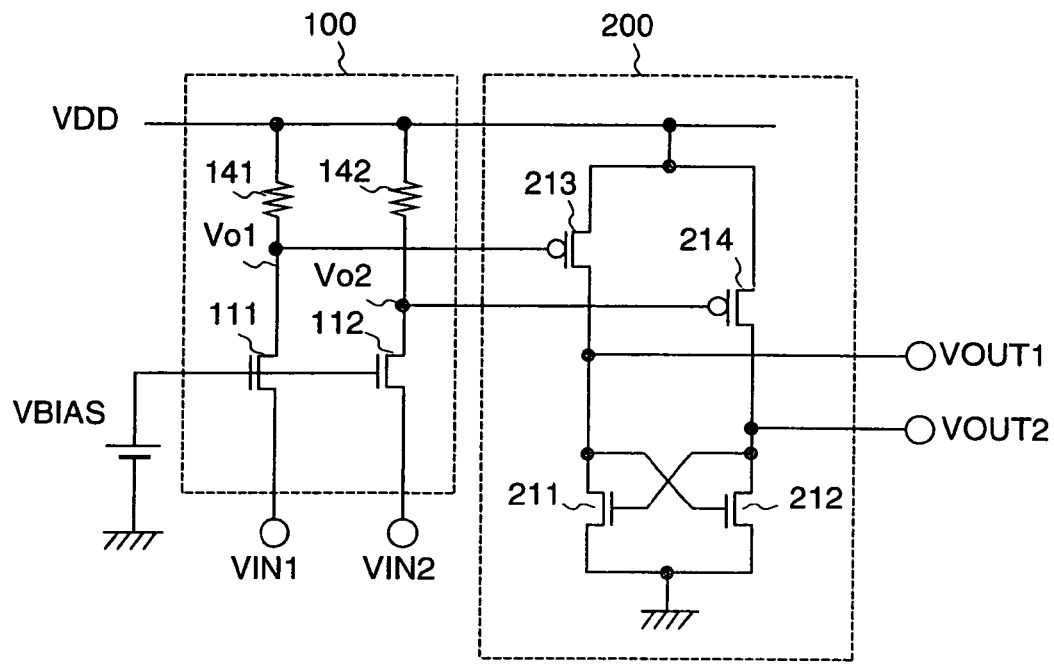
FIG. 5 is a schematic diagram showing a level conversion circuit in a liquid crystal display apparatus representing a fourth embodiment according to the present invention.

FIG. 5 shows a level conversion circuit in a liquid crystal display apparatus representing a fourth embodiment according to the present invention. This fourth embodiment differs from the first embodiment shown in FIG. 1, and the difference is in the level conversion unit 100. The level conversion unit 100 of this fourth embodiment according to the present invention is constituted of resistors 141 and 142 in place of the load transistors 121 and 122, which are employed in the first embodiment shown in FIG. 1.

The operation of the level conversion unit 100 constituted by the fourth embodiment according to the present invention will be explained. As one example of the conditions of operation, the voltages of the input terminals VIN1 and VIN2 are respectively 3.3 V and 0 V, the voltage of the power supply VDD is 15 V and the voltage of the bias power supply is 5.3 V. In this case, the respective input transistors 111 and 112 are respectively in the conductive state and the non-conductive state.

As a result, the output voltages Vo1 and Vo2 of the level conversion circuit 100 are substantially 15 V and substantially 0 V, respectively. Since these output voltages are carried subjected to wave-form shaping in the wave-form shaping unit 200, the voltages of the output terminals VOUT1 and VOUT2 become respectively 0 V and 15 V.

According to the level conversion circuit 100 in the liquid crystal display apparatus of this fourth embodiment according to the present invention, the low amplitude voltage signals of 3.3 V and 0 V, which are supplied to the input terminals VIN1 and VIN2, can be converted to the high amplitude voltage signals of 0 V and 15 V.

Figure 6:
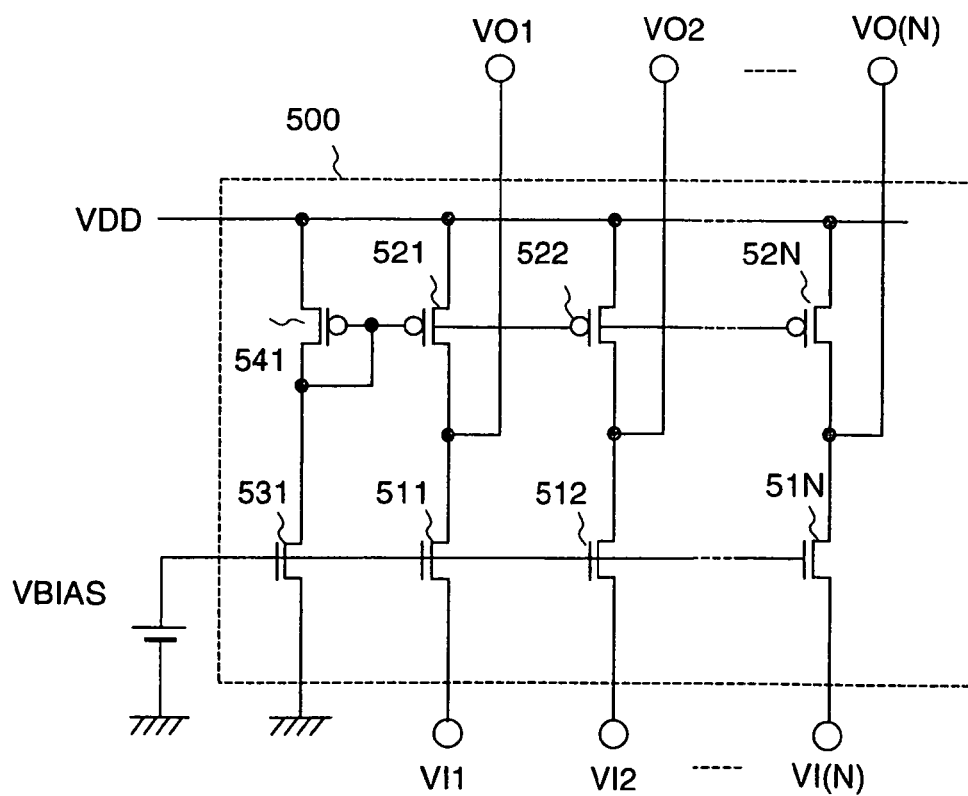
FIG. 6 is a schematic diagram a multi-input type level conversion circuit in a liquid crystal display apparatus representing a fifth embodiment according to the present invention.

FIG. 6 shows a level conversion circuit in a liquid crystal display apparatus representing a fifth embodiment according to the present invention, in the form of a multi-input type level conversion circuit. The level conversion circuit of this fifth embodiment is one in which the level conversion unit of the second embodiment according to the present invention shown in FIG. 3 is formed with a multi-input type level conversion circuit.

A level conversion circuit 500 of this fifth embodiment according to the present invention is constituted of a N number of input transistors 511-51N, and a N number of load transistors 521-52N, along with bias transistors 531 and 541. The respective source electrodes of the input transistors 511-51N are connected to a N number of input terminals V11-V1(N) and the respective drain electrodes of the input transistors 511-51N are connected to the respective drain electrodes of the N number of load transistors 521-52N and to a N number of output terminals VO1-VO(N).

In the level conversion circuit 500 of this fifth embodiment according to the present invention, by adding two transistors, including an input transistor and a load transistor, to the level conversion circuit 500, an effect is achieved in which the number of inputs can be increased.

Figure 7:
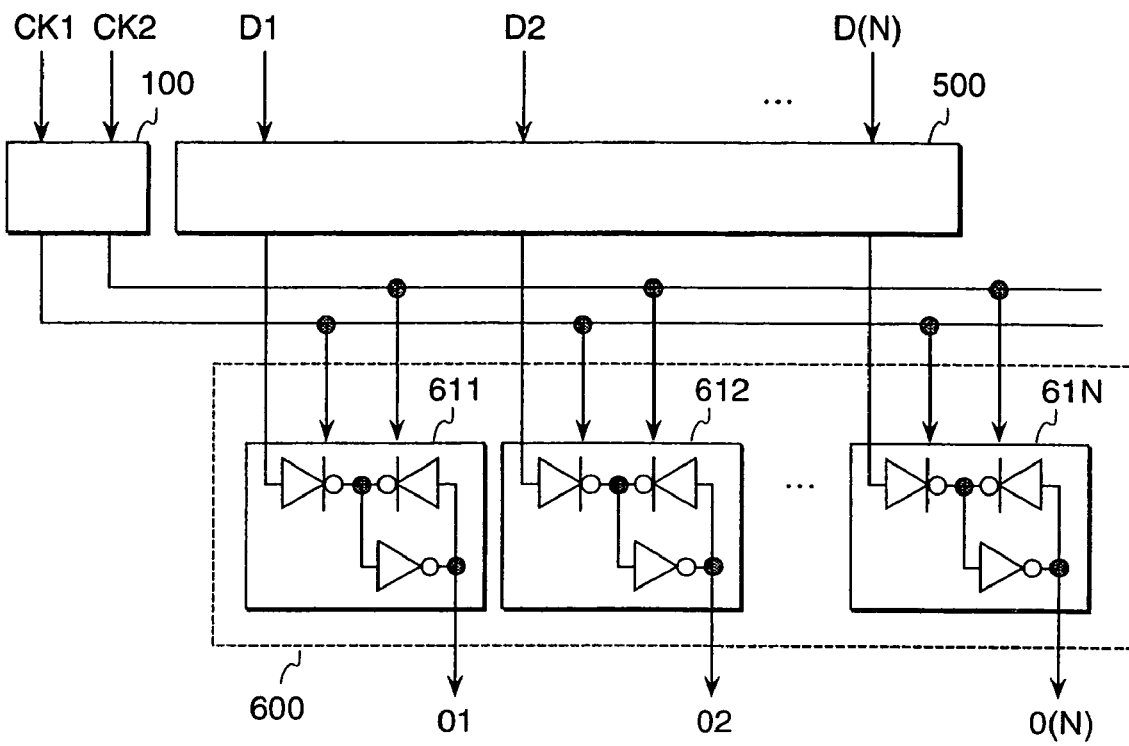
FIG. 7 is a schematic diagram showing one example of a logic input circuit to which the level conversion circuit according to the present invention is applied.

FIG. 7 shows one embodiment of a logic input circuit in which the level conversion circuit according to the present invention is employed. The logic input circuit of this embodiment according to the present invention is constituted of the differential input type level conversion circuit 100, the multi-input type level conversion circuit 500, and a latch circuit unit 600 comprised of N number of latch circuits 611-61(N).

Herein, in the differential input type level conversion circuit 100, differential clock signals CK1 and CK2 having a low voltage amplitude are inputted and differential clock signals which are converted to the high voltage amplitude are outputted to the latch circuits 611-61N. In the multi-input type level conversion circuit 500, a N number of data signals DI-D(N) having a low voltage amplitude are inputted and the data signals DI-D(N) which are converted to the high voltage amplitude are outputted to the respective latch circuits 611-61N.

In the respective latch circuits of the latch circuit unit 600, a clock signal having a high voltage amplitude and a data signal having a high voltage amplitude are inputted and the respective latch circuits are operated, and then a N number of latch data 01-0(N) are outputted.

Figure 8:
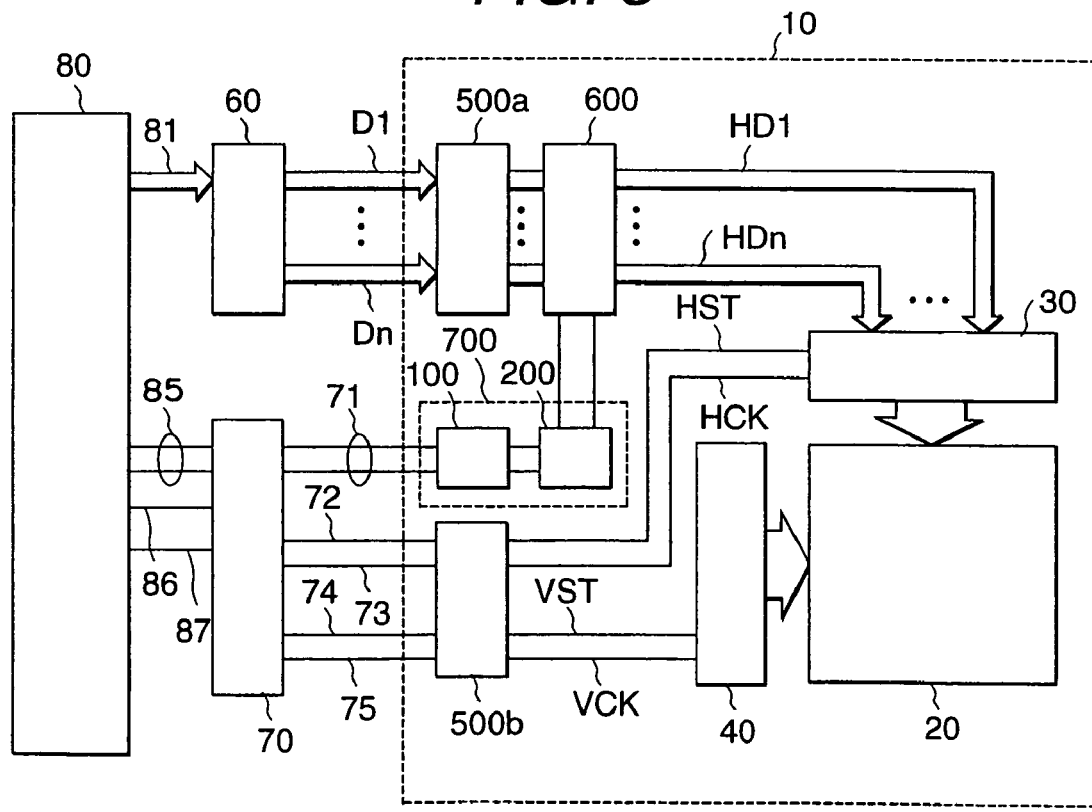
FIG. 8 is a block diagram showing a liquid crystal display apparatus according to the present invention.

FIG. 8 is one example of a system for a liquid crystal display apparatus which incorporates the features according to the present invention. This liquid crystal display apparatus is constituted by an image signal generation apparatus 80, an image signal processing circuit 60, a timing control circuit 70, and a liquid crystal display panel 10.

Herein, the liquid crystal display panel 10 is constituted by a display unit 20 which is comprised of plural pixel elements arranged with a matrix form, a signal circuit 30 and a scanning circuit 40 for driving these pixel elements, a differential input type level conversion circuit 700, multi-input type level conversion circuits 500*a* and 500*b*, and a data latch circuit 600.

Among these elements, the differential input type level conversion circuit 700 is constituted by the level conversion unit 100 and the wave-form shaping unit 200, examples of which have been described with reference to the first embodiment to the fourth embodiment according to the present invention. The multi-input type level conversion circuits 500*a* and 500*b* correspond to the multi-input type level conversion circuit 500, which has been described as the fifth embodiment according to the present invention; and further, the data latch circuit 600 corresponds to the latch circuit unit 600 shown in FIG. 7.

The operation of the system of the liquid crystal display apparatus constituted as described above will be explained. In the image signal generation apparatus 80, an image signal 81 is outputted to the image signal conversion circuit 60, and a clock signal 85, a horizontal synchronization signal 86 and a vertical synchronization signal 87 are inputted to the timing control circuit 70.

In the image signal conversion circuit 60, the signal frequency of the inputted image signal 81 is lowered according to a serial-parallel conversion processing, and n-parallel image signals D1-Dn are formed; and further, these image signals D1-Dn are outputted to the multi-input type level conversion circuit 500*a* of the liquid crystal display panel 10. These image signals D1-Dn are converted to high amplitude signals by the multi-input type level conversion circuit 500*a* and are stored into the data latch circuit 600. The data latch circuit 600 operates to output these stored signals having the high amplitude HD1-HDn into the signal circuit 30.

On the other hand, in the timing control circuit 70, in accordance with the inputted clock signal 85, the inputted horizontal synchronization signal 86 and the inputted vertical synchronization signal 87, a clock signal 71 for taking in the image signals D1-Dn is outputted to the differential input type level conversion circuit 700 of the liquid crystal display panel 10, and further control signals 72-75 for driving the scanning circuit 40 and the signal circuit 30 are outputted to the multi-input type level conversion circuit 500*b* of the liquid crystal display panel 10.

The differential input type level conversion circuit 700 converts the clock signal 71 to a high amplitude clock signal and outputs the converted clock signal to the data latch circuit 600. The multi-input type level conversion circuit 500*b* converts the control signals 72-75 to a clock signal HCK for controlling the signal circuit 30, a start signal HST, a clock signal VCK for controlling the scanning circuit 40, and a start signal VST. The display unit 20 is controlled in accordance with the outputs of the signal circuit 20 and the scanning circuit 40 and displays images which correspond to the image signals D1-Dn.

In the liquid crystal display apparatus constituted as described above, the level conversion circuit is comprised of the level conversion unit 100 and the wave-form shaping unit 200, examples of which have been described with reference to the first embodiment to the fourth embodiment according to the present invention, and the multi-input type level conversion circuit 500 represented by the fifth embodiment according to the present invention.

Accordingly, the input of the liquid crystal display panel 10 can be formed with a low amplitude, and the output circuits of the image signal processing circuit 60 and also the timing control circuit 70 can be constituted simply. Further, an unnecessary radiation of electromagnetic waves can be reduced.

Further, in the embodiments according to the present invention, examples using TFT devices were described, however, it is possible to obtain the same effects using mono-crystallization silicon form MOS transistors. Further, the embodiments according to the present invention can achieve the same effects when the N conductive type transistor and the P conductive type transistor are interchanged therein.

Further, according to the bias power supply of the level conversion circuit, since the drain current operation point of the input transistor and the drain current operation point of the load transistor can be formed with a high current, high speed operation in the level conversion circuit can be attained, and, further, the size of the transistor can be reduced.

Further, since the level conversion circuit is constituted using only transistors, the level conversion circuit can be manufactured easily. Further, since the current of the load transistor is controlled according to the operation of the bias transistor and the output voltage can be generated through the above-stated current and resistance of the input transistor, the fluctuation of the output voltage relative to the fluctuation of the characteristic of the transistor can be restrained, and, as a result, the yield in the manufacture of the level conversion circuit can be heightened.

The level conversion circuit according to the present invention is used as both the signal circuit and the scanning circuit for driving the pixel elements of the display unit of the liquid crystal display apparatus. Of course, the level conversion circuit according to the present invention can be used in only one of the signal circuit and the scanning circuit as well.

What is claimed is:

1. A display apparatus comprising:
   a display unit comprised of pixel elements arranged in a matrix;
   a signal circuit and a scanning circuit for driving the pixel elements;
   a first type level conversion circuit connected to at least one of the signal circuit and the scanning circuit, to perform level conversion of data signals and transmit to the signal circuit and the scanning circuit to drive the pixel elements; and
   a second level conversion circuit connected to at least one of the signal circuit and the scanning circuit, to perform level conversion of differential clock signals to control the transmission of data signals to the signal circuit to drive the pixel elements,
   wherein a differential input type level conversion circuit includes a level conversion unit comprising:
   a first transistor and a second transistor connected in parallel, having respective gate electrodes coupled to receive a bias voltage; and
   a first resistance element and a second resistance element connected in parallel, and disposed between respective drain electrodes of the first transistor and the second transistor and a power supply terminal;
   wherein respective source electrodes of the first transistor and the second transistor are coupled to receive clock signals having a mutually different polarity and a low voltage amplitude, and the respective drain electrodes of the first transistor and the second transistor are coupled to output clock signals having a mutually different polarity and a high voltage amplitude.

2. A display apparatus according to claim 1,
   wherein the second level conversion circuit includes a waveform shaping unit for shaping a waveform of clock signals having said higher voltage amplitude, and comprising:
   a third transistor and a fourth transistor connected in parallel, having respective gate electrodes connected to respective drain electrodes of the first transistor and the second transistor, and
   a fifth transistor and a sixth transistor connected in parallel, having respective drain electrodes connected to respective drain electrodes of the third transistor and the fourth transistor, and having respective source electrodes connected to a ground terminal,
   wherein respective source electrodes of the third transistor and the fourth transistor are coupled to a power supply terminal, and respective gate electrodes of the fifth transistor and the sixth transistor are connected to respective drain electrodes of the sixth transistor and the fifth transistor.

3. A display apparatus according to claim 1,
   wherein the bias voltage is equal to a sum of a peak voltage of clock signals having the low voltage amplitude and a threshold voltage of the first transistor and the second transistor.

4. A display apparatus comprising:
   a display unit comprised of pixel elements arranged in a matrix;
   a signal circuit and a scanning circuit for driving the pixel elements;
   a first level conversion circuit connected to the signal circuit and the scanning circuit, to perform level conversion of data signals and transmit to the signal circuit and the scanning circuit to drive the pixel elements; and
   a second level conversion circuit connected to at least one of the signal circuit and the scanning circuit, to perform level conversion of differential clock signals to control the transmission of data signals to the signal circuit to drive the pixel elements, wherein a differential input type level conversion circuit comprises:
   a plurality of transistors each having a gate electrode coupled to receive to a bias voltage; and
   a plurality of resistance elements each connected between a drain electrode of a respective transistor and a power supply terminal;
   wherein each of a plurality of input pixel element drive signals is inputted to the source electrode of a respective one of the transistors;
   wherein each of control signals is outputted from the drain electrode of a respective transistor; and
   wherein amplitudes of output control signals are higher than amplitudes of input control signals.

5. A display apparatus according to claim 4,
   wherein each resistance element is comprised of a transistor having a gate electrode biased to the bias voltage.

6. A display panel comprising:
   a display unit comprised of pixel elements arranged in a matrix;
   a scanning circuit and a signal circuit arranged to drive pixel elements;
   a first level conversion circuit arranged to generate control signals and to convert image signals having a low voltage amplitude into image signals having a high voltage amplitude;
   a second level conversion circuit arranged to convert differential clock signals having a low voltage amplitude into clock signals having a high voltage amplitude; and
   a latch circuit arranged to latch the image signals having the high voltage amplitude to the signal circuit in accordance with the clock signals having the high voltage amplitude;
   wherein, the signal circuit and the scanning circuit are driven to provide a visual display of images corresponding to the image signals latched from the latch circuit in accordance with the control signals generated from the first level conversion circuit.

7. A display panel according to claim 6,
wherein the second level conversion circuit comprises:
a first transistor and a second transistor connected in parallel, having respective gate electrodes coupled to receive a bias voltage; and
a first resistance element and a second resistance element connected in parallel, and disposed between respective drain electrodes of the first transistor and the second transistor and a power supply terminal;
wherein respective source electrodes of the first transistor and the second transistor are coupled to receive clock signals having a mutually different polarity and a low voltage amplitude, and the respective drain electrodes of the first transistor and the second transistor are coupled to output clock signals having a mutually different polarity and a high voltage amplitude.

8. A display panel according to claim 7,
wherein the second level conversion circuit includes a waveform shaping unit for shaping a waveform of clock signals having the high voltage amplitude, and comprising:
a third transistor and a fourth transistor connected in parallel, having respective gate electrodes connected to respective drain electrodes of the first transistor and the second transistor, and
a fifth transistor and a sixth transistor connected in parallel, having respective drain electrodes connected to respective drain electrodes of the third transistor and the fourth transistor, and having respective source electrodes connected to a ground terminal,
wherein respective source electrodes of the third transistor and, the fourth transistor are coupled to a power supply terminal, and respective gate electrodes of the fifth transistor and the sixth transistor are connected to respective drain electrodes of the sixth transistor and the fifth transistor.

9. A display panel according to claim 8,
wherein the bias voltage is equal to a sum of a peak voltage of clock signals having the low voltage amplitude and a threshold voltage of the first transistor and the second transistor.

10. A display panel according to claim 6,
wherein the second level conversion circuit comprises:
a plurality of transistors each having a gate electrode coupled to receive a bias voltage; and
a plurality of resistance elements each connected between a drain electrode of a respective transistor and a power supply terminal;
wherein each of the control signals is inputted to a source electrode of a respective transistor;
wherein each of the control signals is outputted from the drain electrode of a respective transistor; and
wherein amplitudes of the output control signals are higher than amplitudes of the input control signals.

11. A display panel according to claim 10,
wherein each resistance element is comprised of a transistor having a gate electrode biased to a bias voltage.

12. A display panel according to claim 11,
wherein the bias voltage is equal to a sum of a peak voltage of the input control signals and a threshold voltage of the transistors.

13. A display apparatus comprising:
a display unit comprised of pixel elements arranged in a matrix;
a signal circuit and a scanning circuit for driving the pixel elements;
a first level conversion circuit to perform level conversion of data signals;
a second level conversion circuit connected to at least one of the signal circuit and the scanning circuit, to perform level conversion of differential clock signals to control the transmission of data signals to the signal circuit to drive the pixel elements; and
a latch circuit connected to the first level conversion circuit and the second level conversion circuit, to latch the data signals transmitted from the first level conversion circuit to the signal circuit in accordance with clock signals outputted from the second level conversion circuit;
wherein:
the second conversion circuit converts the differential clock signals having a low voltage amplitude into clock signals having a high voltage amplitude, and outputs the clock signals having the high voltage amplitude to the latch circuit.

14. A display apparatus according to claim 13,
wherein the first level conversion circuit connected to at least one of the signal circuit and the scanning circuit, transmits to the signal circuit and the scanning circuit to drive the pixel elements.

15. A display apparatus according to claim 13,
wherein the first level conversion circuit converts input data signals having a low voltage amplitude to data signals having a high voltage amplitude, and outputs the data signals having the high voltage amplitude to the latch circuit.

16. A display apparatus according to claim 13,
wherein the first level conversion circuit and the second level conversion circuit has a plurality of thin film transistors.

17. A display apparatus according to claim 16,
wherein the thin film transistor has multi-crystallization silicon.

18. A display apparatus according to claim 16,
wherein the first level conversion circuit has a plurality of input terminals and a plurality of output terminals,
the number of input terminals is same as the number of output terminals.

* * * * *